(12) United States Patent
Hsieh et al.

(10) Patent No.: US 8,797,104 B2
(45) Date of Patent: Aug. 5, 2014

(54) AMPLIFIER WITH FLOATING WELL

(75) Inventors: Hsieh-Hung Hsieh, Taipei (TW);
Yi-Hsuan Liu, Hualien (TW);
Chiao-Han Lee, Taichung (TW);
Tzu-Jin Yeh, Hsinchu (TW); Chewn-Pu Jou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 90 days.

(21) Appl. No.: 13/445,955

(22) Filed: Apr. 13, 2012

(65) Prior Publication Data

US 2013/0271223 A1    Oct. 17, 2013

(51) Int. Cl.
*H03F 3/14* (2006.01)

(52) U.S. Cl.
USPC .......................................... 330/307; 330/311

(58) Field of Classification Search
USPC ........... 330/277, 283, 307, 311, 98, 133, 150, 330/310
See application file for complete search history.

(56) References Cited

U.S. PATENT DOCUMENTS

| | | | |
|---|---|---|---|
| 6,822,518 B1 * | 11/2004 | Lin et al. ...................... | 330/311 |
| 6,867,957 B1 * | 3/2005 | Tong et al. ...................... | 361/56 |
| 7,969,243 B2 * | 6/2011 | Bracale et al. ................ | 330/277 |
| 8,039,925 B2 * | 10/2011 | Wong et al. ................... | 257/548 |

OTHER PUBLICATIONS

Doan, C.H. et al., "Millimeter-Wave CMOS Design", IEEE Journal of Solid-State Circuits, Jan. 2005, 40(1):144-155.
Chen, C.C. et al., "A 4.9-dB NF 53.5-62-GHz Micro-machined CMOS Wideband LNA with Small Group-Delay-Variation", 2010 IEEE MTT-S International Microwave Symposium Digest (MTT), May 2010, pp. 489-492.

* cited by examiner

*Primary Examiner* — Khanh V Nguyen
(74) *Attorney, Agent, or Firm* — Duane Morris LLP

(57) ABSTRACT

A low-noise amplifier includes a first transistor having a gate configured to receive an oscillating input signal and a source coupled to ground. A second transistor has a source coupled to a drain of the first transistor, a gate coupled to a bias voltage, and a drain coupled to an output node. At least one of the first and second transistors includes a floating deep n-well that is coupled to an isolation circuit.

20 Claims, 8 Drawing Sheets

AMPLIFIER WITH FLOATING WELL

FIELD OF DISCLOSURE

The disclosed circuits and methods relate to millimeter wave receivers. More specifically, the disclosed circuits and methods relate to millimeter wave receivers including a low noise amplifiers having gain enhancement.

BACKGROUND

Millimeter-wave frequencies generally refer to signals in the frequency band between approximately 30 GHz to 300 GHz, which are frequently used in various applications such as wireless personal area networks ("WPANs"), automobile radar, and image sensing. Various LNAs for millimeter waves have been disclosed. However, LNAs implemented using compound III-V semiconductors or BJTs are not easily integrated with the other components of the receiver, especially for digital circuits, resulting in higher implementation costs.

Recent advances in complementary metal oxide semiconductor ("CMOS") technologies have enabled millimeter-wave integrated circuits to be implemented at lower costs as multi-stage LNAs. To obtain sufficient amplification, LNAs are typically implemented with at least two stages with input, output, and inter-stage matching networks.

DETAILED DESCRIPTION

This description of the exemplary embodiments is intended to be read in connection with the accompanying drawings, which are to be considered part of the entire written description.

An improved low noise amplifier ("LNA") is disclosed in which at least one transistor is implemented with a floating deep n-well ("DNW"). The floating DNW advantageously reduces the contribution of the n-well to source degeneration experienced by the LNA and/or improves the gain performance by reducing the body effect.

Figure 1B:
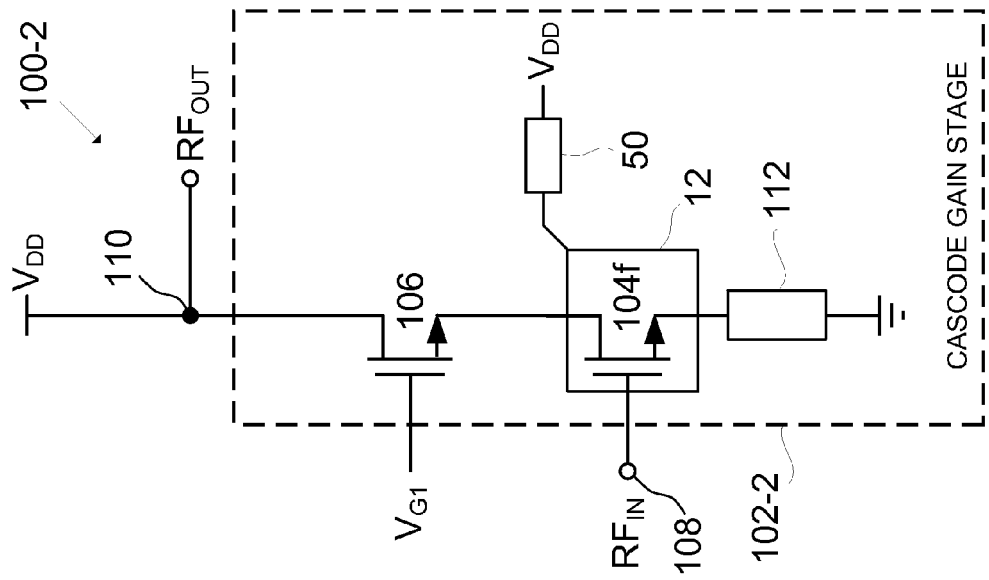
FIGS. 1A-1C illustrate various embodiments of single-stage low-noise amplifiers in accordance with some embodiments.
Figure 1A:
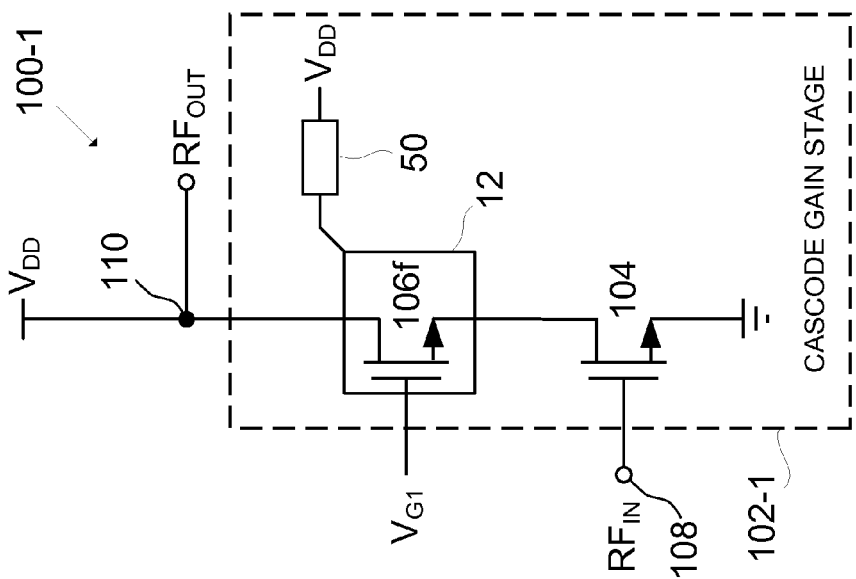
Figure 1C:
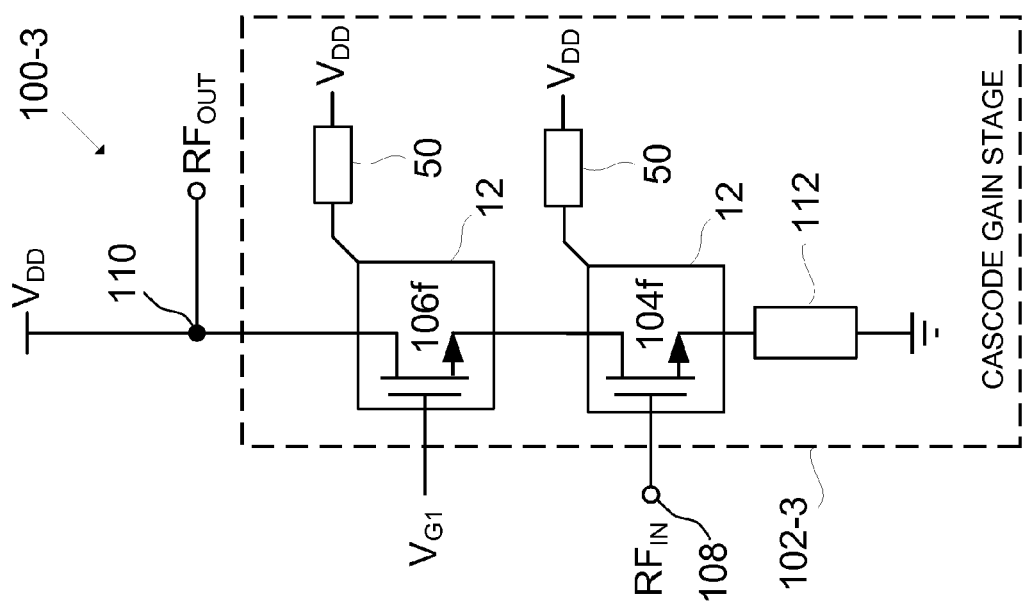

FIGS. 1A-1C are circuit diagrams of various embodiments of single-stage LNAs in which one or more transistors are formed using a floating DNW. Referring first to FIG. 1A, LNA 100-1 includes a cascode gain stage 102-1 comprising a common-source transistor 104 coupled to a common-gate transistor 106f implemented with a floating DNW using an isolation circuit 50 that is described in more detail below. Common-source transistor 104 has its source coupled to ground and its drain coupled to the source of common-gate transistor 106f. The gate of transistor 104 is coupled to input node 108, which receives an oscillating input signal, $RF_{IN}$.

Common-gate transistor 106f has its gate coupled to a bias voltage source having a voltage $V_{G1}$, which may be set at ground. The drain of transistor 106f is coupled to node 110, which is coupled to a high voltage supply, $V_{DD}$. Node 110 also serves as the output node of the single-stage LNA 100-1 from which output signal, $RF_{OUT}$, is output. Each of the circuit elements of LNA 100-1 may be implemented using complementary metal oxide semiconductor ("CMOS") technology.

FIG. 1B illustrates another example of a single-stage LNA 100-2 comprising a cascode gain stage 102-2 including a common-source transistor 104f, which is formed with a floating DNW using an isolation circuit 50, and a common-gate transistor 106. Common-source transistor 104f has its source coupled to a source degeneration circuit 112, which may be implemented as an inductor as will be understood by one of ordinary skill in the art. The gate of common-source transistor 104f is coupled to input node 108, which receives input signal $RF_{IN}$, and the drain of transistor 104f is coupled to the source of common-gate transistor 106.

The gate of common-gate transistor 106 is coupled to a bias voltage source having a voltage $V_{G1}$, which may be set at ground. The drain of transistor 106 is coupled to node 110, which is coupled to a high voltage supply, $V_{DD}$ and serves as the output node.

Another embodiment of a single-stage LNA 100-3 is illustrated in FIG. 1C in which both common-source transistor 104f and common-drain transistor 106f are implemented with floating DNWs. The DNWs are isolated through the incorporation of isolation circuits 50 between the DNW and the high voltage supply, $V_{DD}$, as described in greater detail below. Transistors 104f and 106f form a cascode gain stage 102-3 with the gate of transistor 104f being coupled to input node 108, which receives input signal $RF_{IN}$. The source of common-source transistor 104f is coupled to ground through source degeneration circuit 112. The drain of transistor 104f is coupled to the source of transistor 106f, which has its drain coupled to output node 110. The gate of common-gate transistor 106f is coupled to voltage supply $V_{G1}$, which is set at ground potential.

Figure 2A:
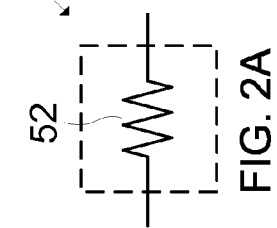
FIGS. 2A-2C illustrate various embodiments of isolation circuits in accordance with the low noise amplifiers illustrated in FIGS. 1A-1C.
Figure 2B:
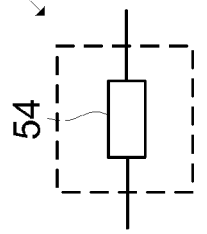
Figure 2C:
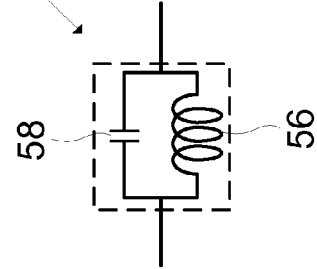

Isolation circuit 50 may be implemented in a variety of ways as illustrated in FIGS. 2A-2C. In the embodiment illustrated in FIG. 2A, isolation circuit 50-1 is implemented as a resistor 52 having a large resistance. In some embodiments, for example, the resistance of resistor 52 is greater than or equal to 3 kΩ. In some embodiments, resistor has a resistance that is greater than or equal to 10 kΩ.

In the embodiment illustrated in FIG. 2B, isolation circuit 50-2 includes a quarter wavelength transmission line 54. In some embodiments, such as the embodiment illustrated in FIG. 2C, isolation circuit 50-3 is implemented as an LC tank comprising an inductor 56 disposed in parallel with a capacitor 58. As will be understood by one of ordinary skill in the art, the resonant frequency of the LC tank may be selected to isolate the DNW from $V_{DD}$ as described in greater detail below.

Figure 3A:
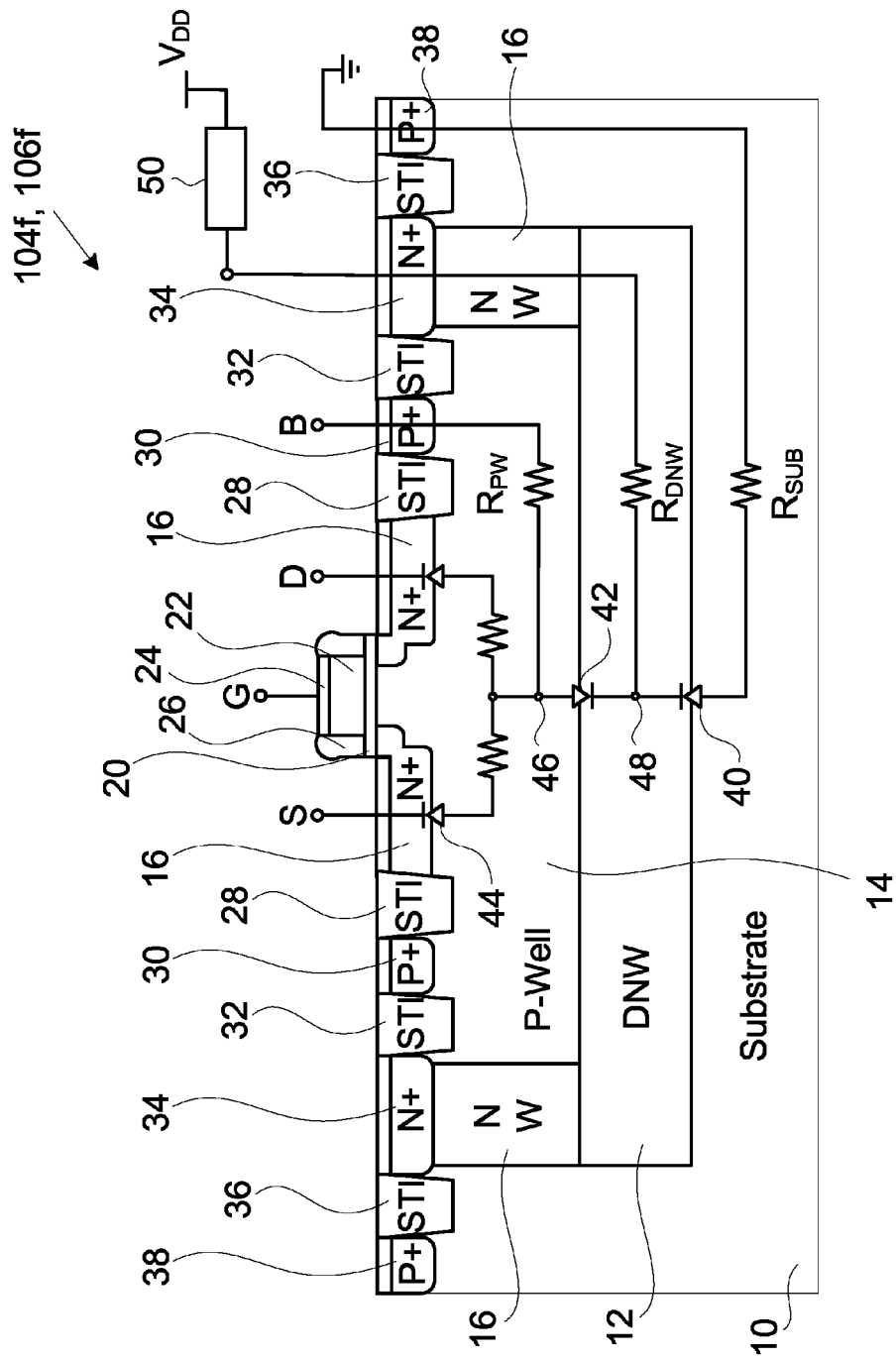
FIG. 3A is a cross-sectional view of transistors with floating deep n-wells in accordance with the low-noise amplifiers illustrated in FIGS. 1A-1C.
Figure 3B:
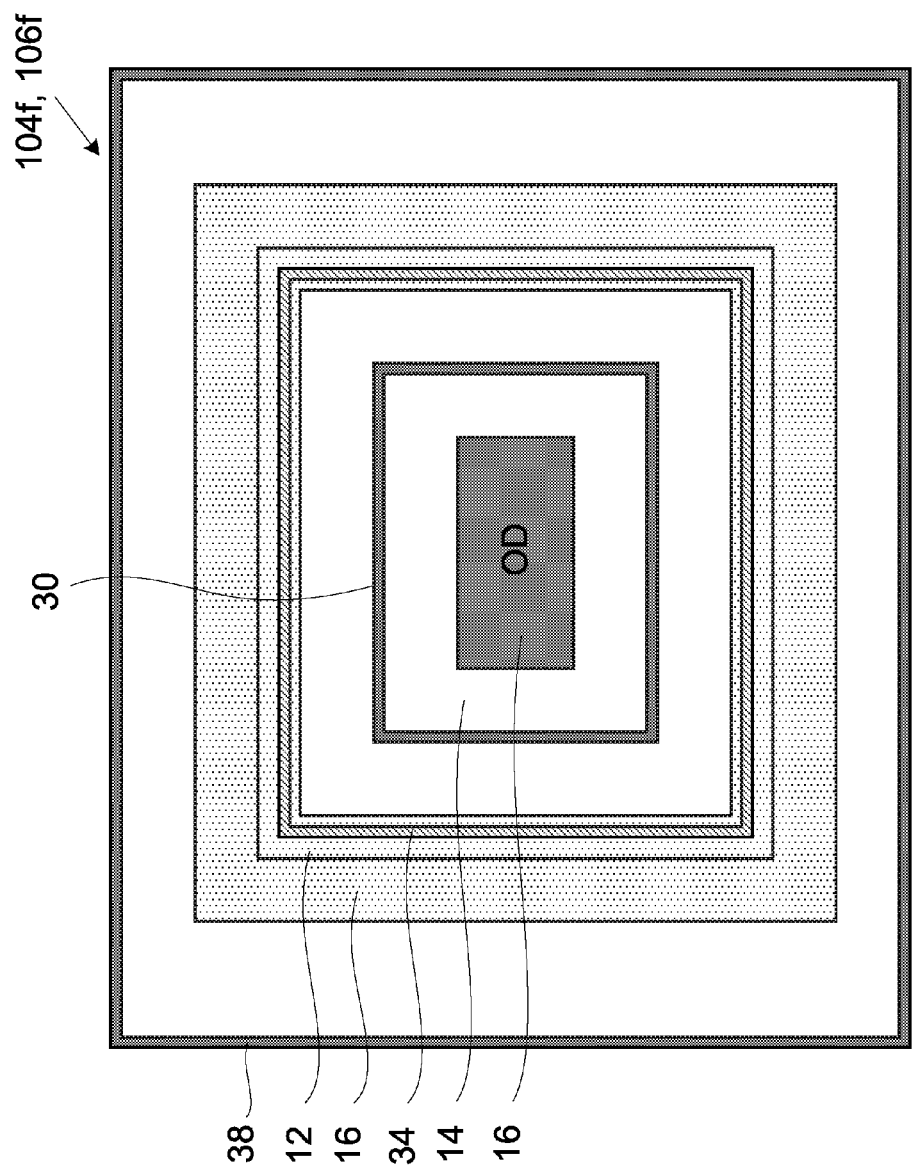
FIG. 3B is a plan view of a transistor with a floating deep n-well in accordance with some embodiments.

FIG. 3A is a cross-sectional view of a transistor formed in a floating DNW 12, e.g., transistors 104f and 106f, and FIG. 3B is a plan view of such transistor. As shown in FIGS. 3A and 3B, transistors 106f, 106f are formed over a semiconductor substrate 10, which may be doped with a p-type material. As will be understood by one of ordinary skill in the art, semiconductor substrate 10 can be formed from a variety of materials including, but not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof.

A DNW 12 is formed in substrate 10. DNW 12 is formed by doping the semiconductor substrate with a suitable n-type material such as, for example, arsenic, phosphorus, antimony, or other Group V element as will be understood by one of ordinary skill in the art. A p-well 14 is formed over DNW 12 and is laterally bounded by an n-well 16. P-well 14 is formed by doping the area of p-well 14 with any suitable p-type dopant such as, for example, boron, gallium, aluminum, or any Group III element.

The sources and drains of transistors 104f, 106f are formed by N+ region 18, which is doped with a suitable n-type dopant to a higher concentration of n-type dopant than DNW 12 and n-well 16. The gate of transistors 104f, 106f is formed over the channel region between N+ regions 16 by depositing a gate oxide 20 over the channel, forming a gate dielectric 22 over the gate oxide 20, and forming a gate electrode 24 over gate dielectric 22. Sidewalls 26 may be disposed on the sides of gate dielectric 22 and gate electrode 24.

A shallow trench isolation ("STI") region 28 is disposed adjacent to N+ region 16 in an upper surface of p-well 14. STI region 28 separates N+ region from P+ region 30, which is laterally spaced from N+ region in the upper surface of p-well 14. Another STI region 32 is formed adjacent to P+ region 30 in the upper surface of p-well 14 and isolates P+ region 30 from N+ region 34, which is formed in the upper surface of n-well 16. STI region 36 is formed in the upper surface of semiconductor substrate 10 and separates N+ region 34 from P+ region 38. P+ region 38 is laterally disposed from STI region 36 in the upper surface of substrate 10.

Substrate 10, DNW and n-well 12, 16, and p-well 14 have respective resistances $R_{SUB}$, $R_{DNW}$, and $R_{PW}$. A diode 40 is formed at the interface of substrate 10 and DNW 12, and a diode 42 is formed at the interface between DNW 12 and p-well 14. A diode 44 is formed at the interface of p-well 14 and N+ region 16. The anode of diode 44 is coupled to the anode of diode 42 at node 46, which is coupled to P+ region 30 through the p-well resistance, RPW. P+ region 30 serves as the bulk contact for transistor 106.

The cathode of diode 42 is coupled to the cathode of diode 40 at node 48. Node 48 is coupled N+ region 34 through the n-well resistance, $R_{DNW}$. N+ region 34 is also coupled to isolation circuit 50, which is disposed between N+ region and a voltage source set at $V_{DD}$, which is equivalent to alternating current ("AC") ground. Isolation circuit 50 advantageously isolates DNW 12 from a voltage such that DNW 12 is effectively floating. With DNW 12 floating, a signal loss path from the source to body due to the body effect is reduced and the gain of amplifier 100 is improved. The cathode of diode 40 is coupled to P+ region 38 through substrate resistance $R_{SUB}$. The P+ region 38 is coupled to ground.

Figure 4:
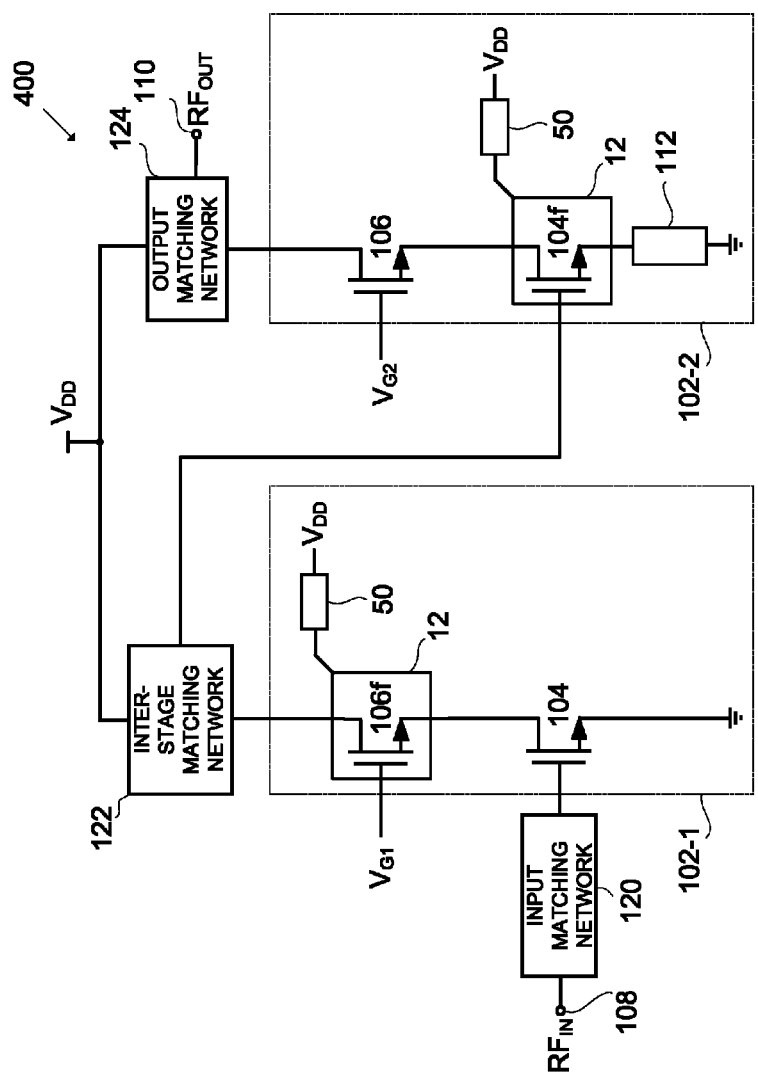
FIG. 4 illustrates one example of a two-stage low-noise amplifier in accordance with some embodiments.

As will be understood by one of ordinary skill in the art, LNAs may be implemented having more than one stage. FIG. 4 illustrates one example of a two-stage LNA 400 in which one or more transistors are implemented with a floating DNW. As shown in FIG. 4, input node 108 is coupled to an input matching network 120, which is coupled to the gate of common-source transistor 104 of cascode gain stage 102-1. Common-source transistor 104 has its source coupled to ground and its drain coupled to the source of common-gate transistor 106f, which is formed with a floating DNW using isolation circuit 50.

The gate of common-gate transistor 106f is coupled to a voltage source, VG1, which may have a voltage of ground. The drain of common-gate transistor 106f is coupled to an inter-stage matching network 122, which is coupled to $V_{DD}$ and to the gate of common-source transistor 104f of cascode gain stage 102-2. Common-source transistor 104f of cascode gain stage 102-2 is coupled to source degeneration circuit 112 that is also coupled to ground. The drain of transistor 104f is coupled to the source of common-gate transistor 106.

The gate of common-gate transistor 106 is coupled to a voltage supply set at bias voltage $V_{G2}$, which can be set at ground potential. The drain of common-gate transistor 106 is coupled to output matching network 124. Output matching network 124 is coupled to voltage supply $V_{DD}$ and to output node 110.

Figure 5:
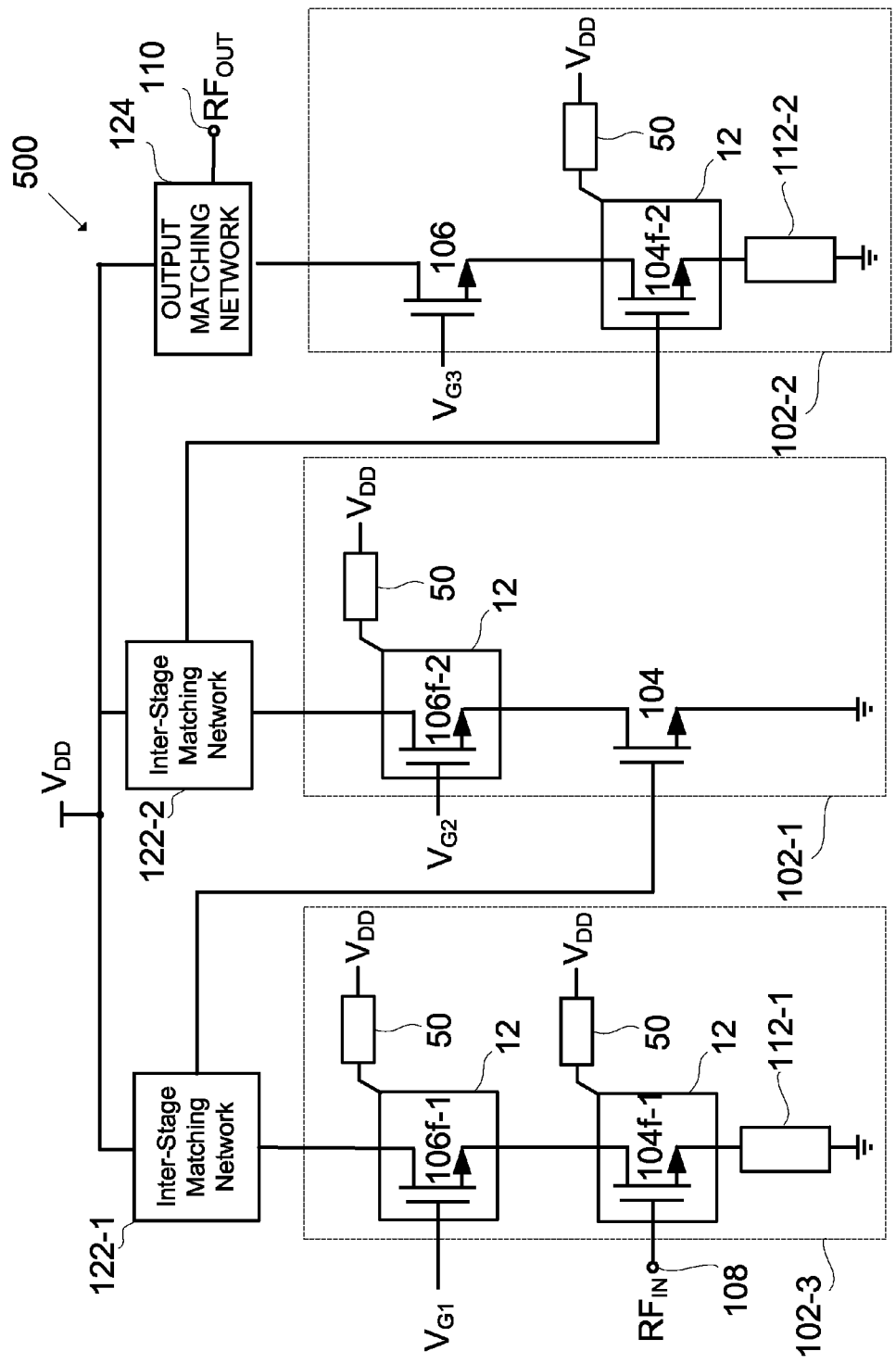
FIG. 5 illustrates one example of a three-stage low-noise amplifier in accordance with some embodiments.

FIG. 5 illustrates one embodiment of a three-stage LNA 500 in which each stage has at least one transistor that includes a floating DNW. In particular, LNA 500 includes a first stage 102-3 in which common-source transistor 104f-1 and common-gate transistor 106f-1 each include a floating DNW provided by a respective isolation circuit 50. Transistor 104-1 has its source coupled to a source degeneration circuit 112-1, which is implemented as an inductor in some embodiments, a gate coupled to input node 108, and its drain coupled to the source of transistor 106f-1. Transistor 106f-1 has its gate coupled to a first bias voltage supply, $V_{G1}$, and its drain coupled to inter-stage matching network 122-1.

Inter-stage matching network 122-1 is coupled to $V_{DD}$ and to the input of the second cascode gain stage 102-1. As shown in FIG. 5, inter-stage matching network 122-1 is coupled to the gate of common-source transistor 104, which has its source directly coupled to ground. The drain of transistor 104 is coupled to the source of common-gate transistor 106f-2, which includes a floating DNW provided by isolation circuit 50. The gate of transistor 106f-2 is coupled to a bias voltage supply, VG2, and the drain of transistor 106f-2 is coupled to inter-stage matching network 122-2.

Inter-stage matching network 122-2 is coupled to $V_{DD}$ and to the input of the third cascode gain stage 102-2, which includes a common-source transistor 104f-2 having a floating DNW, a common-gate transistor 106, and a source degeneration circuit 112-2. Transistor 104f-2 has its source coupled to source degeneration circuit 112-2 and its drain coupled the source of common-gate transistor 106, which has its gate coupled to bias voltage supply $V_{G3}$. The drain of transistor 106 is coupled to output matching network 124, which is coupled to $V_{DD}$ and to output node 110. One of ordinary skill in the art will understand that other multi-stage embodiments are possible.

Figure 6:
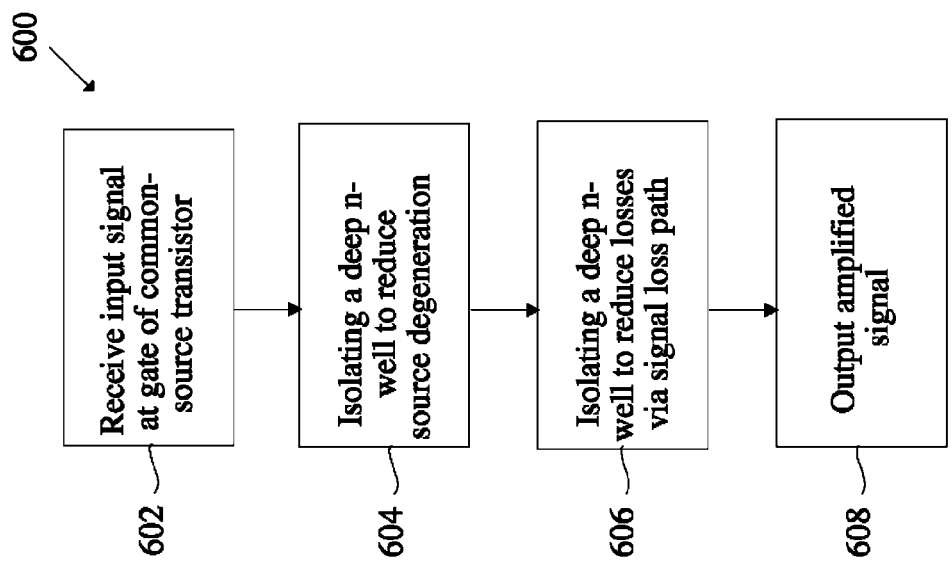
FIG. 6 is a flow diagram of one example of a method of amplifying an oscillating input signal in accordance with some embodiments.

The operation of an LNA is described with reference to FIG. 1C and FIG. 6, which is a flow diagram of one example of a method 600 of amplifying an oscillating signal. At block 602, an oscillating input signal is received at the gate of common-source transistor 104f, which has its source coupled to inductive source degeneration circuit 112. As will be understood by one of ordinary skill in the art, when the voltage of $RF_{IN}$ exceeds the threshold voltage of transistor 104f, transistor 104f is in a current-conducting 'on' state. Transistor 104f is in a non-current-conducting 'off' state when the voltage of $RF_{IN}$ is below the threshold voltage of transistor 104f.

At block 604, excessive source degeneration of transistor 104f is limited by the floating DNW of transistor 104f. As best seen in FIG. 3, node 48 in DNW 12 of transistor 104f is disposed between diodes 40 and 42, which tend to degenerate due to the parasitic path through RDNW, n-well 16, and N+ region 34 when an isolation device 50 is not present. The inclusion of isolation device 50, such as, for example, a large resistor 52, a quarter-wavelength transmission line 54, or an LC tank including an inductor 56 and parallel capacitor 58, effectively provides an open circuit between VDD and N+ region 34 such that diodes 40 and 42 do not further degenerate.

At block 606, losses over signal loss path of common-gate transistor 106f are reduced. Referring again to FIG. 3, common-gate transistor 106f includes an isolation circuit 50 that separates $V_{DD}$ from DNW 12 such that the voltage potential of DNW 12 is effectively floating. For example, isolation circuit 50 prevents signal loss via a signal loss path that is defined from node 46 through diode 42, DNW 12, n-well 16, and N+ region 34 to $V_{DD}$ by blocking current from traveling along this path.

At block 608, an amplified oscillating signal is output from node 110 of LNA 100-3. The output amplified signal, $RF_{OUT}$, experiences an improved gain with a lower noise factor compared to LNAs that do not include floating gates.

Figure 7:
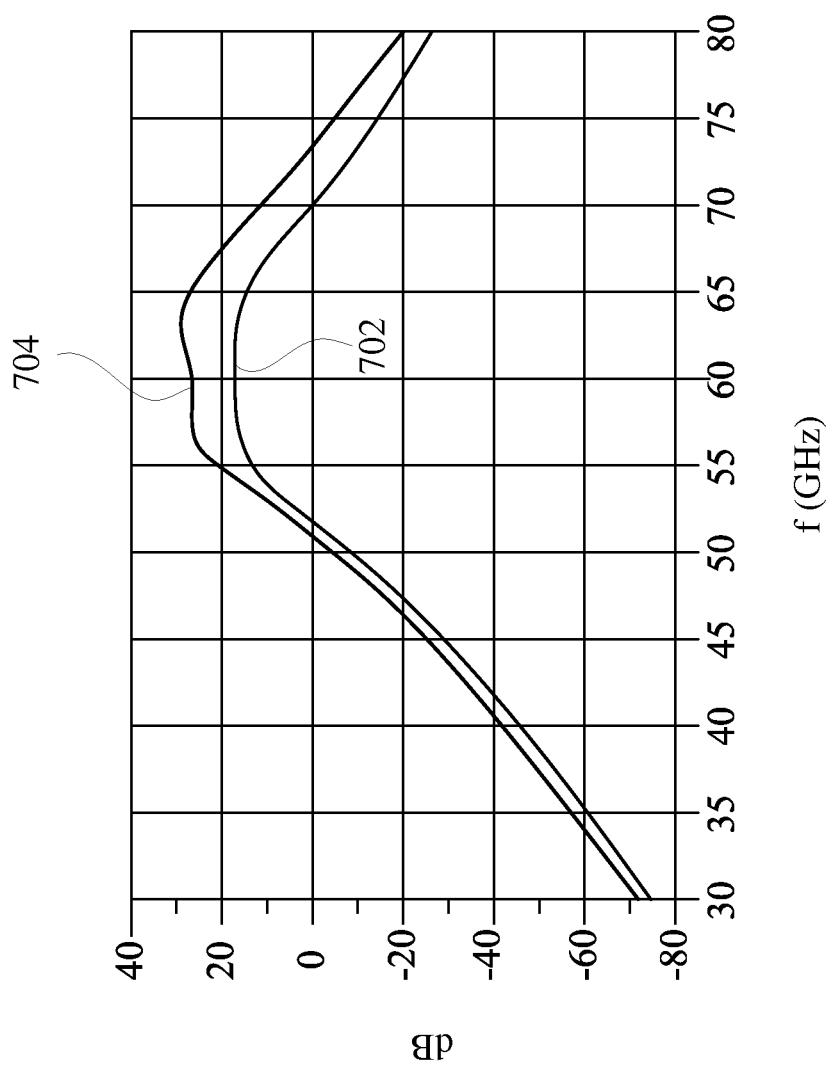
FIG. 7 is a graph comparing the gain performance of an LNA in accordance with the present disclosure to an LNA formed from transistors not having a floating deep n-well.

For example, FIG. 7 is a gain versus frequency graph comparing the gain of an LNA that does not include transistors having floating DNWs (trace 702) to the gain of an LNA that does include transistors having floating DNWs (trace 704). As shown in FIG. 7, the output signal of the LNA with a floating DNW 704 has a gain of approximately 25 dB at 60 GHz compared to the LNA without a floating DNW 702, which has a gain of approximately 16.8 dB at 60 GHz. The noise factor of the LNA with transistors including a floating DNW had a noise factor improved of approximately 2 dB compared to the LNA having transistors without a floating DNW. The floating DNW for trace 704 was achieved using a resistor 52 having a resistance of 3 kΩ for isolation circuit 50.

The improved LNAs disclosed herein advantageously include at least one transistor having a floating DNW, which reduces the contribution of the n-well to source degeneration experienced by the LNA and/or improves the gain performance by reducing the body effect. The LNAs described herein are suitable for high-k metal gate processes that conventionally exhibit reduced maximum frequencies due to the increased gate resistance.

In some embodiments, a low-noise amplifier includes a first transistor having a gate configured to receive an oscillating input signal and a source coupled to ground. A second transistor has a source coupled to a drain of the first transistor, a gate coupled to a bias voltage, and a drain coupled to an output node. At least one of the first and second transistors includes a floating deep n-well that is coupled to an isolation circuit.

In some embodiments, a low-noise amplifier includes first and second stages. The first stage includes a first transistor having a gate configured to receive an oscillating input signal and a source coupled to ground. A second transistor has a source coupled to a drain of the first transistor, a gate coupled to a bias voltage, and a drain coupled to an output node of the first stage. The second stage includes a third transistor having a gate coupled to the output node of the first stage and a source coupled to ground. A fourth transistor has a source coupled to a drain of the third transistor, a gate coupled to a bias voltage, and a drain coupled to an output node. At least one of the first, second, third, and fourth transistors includes a floating deep n-well that is coupled to an isolation circuit.

A method includes receiving an oscillating input signal at a gate of a common-source transistor of a low-noise amplifier. A deep n-well is permitted to float such that the deep n-well is isolated from a body of at least one of the common-source transistor or a body of a common-gate transistor having a source coupled to the drain of the common-source transistor. An amplified signal is output from an output node of the low-noise amplifier.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A low-noise amplifier, comprising:
   a first transistor having a gate configured to receive an oscillating input signal and a source coupled to ground; and
   a second transistor having a source coupled to a drain of the first transistor, a gate coupled to a bias voltage, and a drain coupled to an output node,
   wherein the first transistor includes a floating deep n-well that is coupled to an isolation circuit, and the source of the first transistor is coupled to ground through a source degeneration circuit.

2. The low-noise amplifier of claim 1, wherein the second transistor includes a floating deep n-well.

3. The low-noise amplifier of claim 1, wherein the isolation circuit includes at least one of a resistor, an LC tank, or a quarter-wave transmission line.

4. The low-noise amplifier of claim 3, wherein the isolation circuit includes a resistor having a resistance of at least 3 kΩ.

5. The low-noise amplifier of claim 1, wherein the isolation circuit is coupled to a first doped region of a first type that is formed in an upper surface of a well of a first type that is formed over the deep n-well.

6. The low-noise amplifier of claim 1, wherein the floating deep n-well is disposed between a p-well and a substrate, a first diode is formed at an interface between the floating deep n-well and the p-well, and a second diode is formed at an interface between the floating deep n-well and the substrate.

7. The low-noise amplifier of claim 6, wherein an n-well is formed above the floating deep n-well and adjacent to the p-well.

8. The low-noise amplifier of claim 7, wherein another diode is formed at an interface between the p-well and an N+ region formed at an upper surface of the p-well.

9. A low-noise amplifier, comprising:
   a first stage including
      a first transistor having a gate configured to receive an oscillating input signal and a source coupled to ground, and
      a second transistor having a source coupled to a drain of the first transistor, a gate coupled to a bias voltage, and a drain coupled to an output node of the first stage; and
   a second stage including
      a third transistor having a gate coupled to the output node of the first stage and a source coupled to ground, and
      a fourth transistor having a source coupled to a drain of the third transistor, a gate coupled to a bias voltage, and a drain coupled to an output node,
   wherein at least one of the first, second, third, and fourth transistors includes a floating deep n-well that is coupled to an isolation circuit.

10. The low-nose amplifier of claim 9, wherein the second transistor includes the floating deep n-well.

11. The low-noise amplifier of claim 9, wherein the first transistor includes the floating deep n-well, and the source of the first transistor is coupled to ground through a source degeneration circuit.

12. The low-noise amplifier of claim 9, wherein both the first and second transistors include floating deep n-wells, the source of the first transistor being coupled to ground through a source degeneration circuit.

13. The low-nose amplifier of claim 9, wherein the fourth transistor includes the floating deep n-well.

14. The low-noise amplifier of claim 9, wherein the third transistor includes the floating deep n-well, and the source of the third transistor is coupled to ground through a source degeneration circuit.

15. The low-noise amplifier of claim 9, wherein the isolation circuit includes at least one of a resistor, an LC tank, or a quarter-wave transmission line.

16. The low-noise amplifier of claim 15, wherein the isolation circuit includes a resistor having a resistance of at least 3 kΩ.

17. A method, comprising:
receiving an oscillating input signal at a gate of a common-source transistor of a low-noise amplifier;
permitting a deep n-well to float, wherein the deep n-well is isolated from a body of at least one of the common-source transistor or a body of a common-gate transistor having a source coupled to the drain of the common-source transistor; and
outputting an amplified signal from an output node of the low-noise amplifier,
wherein the common-source transistor includes the deep n-well, and the source of the common-source transistor is coupled to ground through a source degeneration circuit.

18. The method of claim 17, wherein the common-gate transistor includes the deep n-well.

19. The method of claim 17, wherein the method includes isolating a second deep n-well from the body of the common-gate transistor.

20. The method of claim 17, wherein the deep n-well is isolated from the body of one of the common-source transistor or the body of the common-gate transistor by an isolation circuit that includes at least one of a resistor, an LC tank, or a quarter-wave transmission line.

* * * * *

UNITED STATES PATENT AND TRADEMARK OFFICE
CERTIFICATE OF CORRECTION

PATENT NO. : 8,797,104 B2
APPLICATION NO. : 13/445955
DATED : August 5, 2014
INVENTOR(S) : Hsieh-Hung Hsieh et al.

Page 1 of 1

It is certified that error appears in the above-identified patent and that said Letters Patent is hereby corrected as shown below:

In the Claims:

Claim 10, Column 6, Line 66 – delete "low-nose" and insert -- low-noise --.

Claim 13, Column 7, Line 9 – delete "low-nose" and insert -- low-noise --.

Signed and Sealed this
Fourteenth Day of April, 2015

Michelle K. Lee
*Director of the United States Patent and Trademark Office*